(12) United States Patent
Bi (10) Patent No.: US 8,896,513 B2
(45) Date of Patent: Nov. 25, 2014

(54) GAMMA BUS AMPLIFIER OFFSET CANCELLATION

(75) Inventor: Yafei Bi, Palo Alto, CA (US)

(73) Assignee: Apple Inc., Cupertino, CA (US)

( * ) Notice: Subject to any disclaimer, the term of this patent is extended or adjusted under 35 U.S.C. 154(b) by 332 days.

(21) Appl. No.: 13/364,045

(22) Filed: Feb. 1, 2012

(65) Prior Publication Data

US 2013/0194284 A1    Aug. 1, 2013

(51) Int. Cl.
*G09G 3/36*    (2006.01)

(52) U.S. Cl.
USPC ............................................. 345/98; 345/690

(58) Field of Classification Search
USPC .................... 345/87–104, 690–693
See application file for complete search history.

(56) References Cited

U.S. PATENT DOCUMENTS

| | | | |
|---|---|---|---|
| 6,163,289 A | 12/2000 | Ginetti | |
| 6,388,653 B1 | 5/2002 | Goto | |
| 6,950,045 B2 | 9/2005 | Kim | |
| 2008/0143665 A1 | 6/2008 | Nishimura | |
| 2008/0150855 A1 | 6/2008 | Chen | |
| 2008/0150866 A1 | 6/2008 | Maki | |
| 2008/0198118 A1* | 8/2008 | Choi | 345/89 |
| 2008/0303809 A1* | 12/2008 | Lee | 345/215 |
| 2010/0039453 A1 | 2/2010 | Chaji et al. | |
| 2010/0225678 A1 | 9/2010 | Kim et al. | |
| 2011/0140944 A1 | 6/2011 | Hirai | |
| 2011/0227891 A1 | 9/2011 | Lee | |

OTHER PUBLICATIONS

PCT International Search Report for PCT Application No. PCT/US2013/024390, dated May 28, 2013, 5 pgs.

* cited by examiner

*Primary Examiner* — Jimmy H Nguyen
(74) *Attorney, Agent, or Firm* — Fletcher Yoder PC (57) ABSTRACT

The present disclosure generally relates to gamma bus wiring techniques that saves space in a display such as a liquid crystal display. In certain embodiments, a voltage offset associated with gamma bus amplifiers configured to provide analog voltage levels to a pixel may reduce at least some of the visual performance characteristics of the attached display when it transitions between different voltage values provided by different gamma bus amplifiers. The voltage offsets associated with the gamma bus amplifiers may be distributed between multiplexers that are coupled to gamma bus amplifiers by interlacing the wires routed from a resistor string to the multiplexers.

23 Claims, 6 Drawing Sheets

GAMMA BUS AMPLIFIER OFFSET CANCELLATION

BACKGROUND

The present disclosure relates generally to electronic displays and, more particularly, to techniques for correcting for voltage offsets associated with gamma bus amplifiers used in such displays. This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Liquid crystal displays (LCDs) are commonly used as screens or displays for a wide variety of electronic devices, including such consumer electronics as televisions, computers, and handheld devices (e.g., cellular telephones, audio and video players, gaming systems, and so forth). Such LCD devices typically provide a flat display in a relatively thin and low weight package that is suitable for use in a variety of electronic goods. In addition, such LCD devices typically use less power than comparable display technologies, making them suitable for use in battery powered devices or in other contexts where it is desirable to minimize power usage.

LCD devices typically include thousands (or millions) of picture elements, i.e., pixels, arranged in rows and columns. For any given pixel of an LCD device, the amount of light that viewable on the LCD depends on the voltage applied to the pixel. Typically, LCDs include driving circuitry (e.g., gamma block) for converting digital image data into analog voltage values that may be supplied to pixels within a display panel of the LCD. Traditionally, the driving circuitry for N-bit displays includes $2^N$ wires that have $2^N$ different analog voltage levels that represent $2^N$ gray levels. All of the $2^N$ wires are typically coupled to a unit source driver for each pixel in the display. Accordingly, for an 8-bit display, 256 wires are used, and such a large number of wires occupies valuable space on the display.

To save space, the number of wires coupled between the driving circuitry and the unit source driver may be reduced using multiplexers. For instance, 256 wires traditionally used in an 8-bit display may be routed to sixteen different 16-wire multiplexers. The sixteen multiplexers may then multiplex the received voltage values over time and provide 16 different multiplexed outputs that may be used to represent the 256 voltage using only 16 wires. Each of these multiplexer outputs is typically coupled to a gamma bus amplifier that buffers each multiplexed signal to allow the multiplexed signal time to settle. The gamma bus amplifiers may then output buffered multiplexed signals to the unit source driver of a pixel. The unit source driver may then determine the analog voltage level that corresponds to the buffered multiplexed signal and may forward this analog voltage level to the pixel.

Unfortunately, each gamma bus amplifier has a voltage offset value, which can cause visual performance issues when the unit source driver transitions between two voltage values that are output by two different gamma bus amplifiers. Thus, although this multiplexing technique may save space, it may not produce the same visual performance characteristics as the traditional driving circuitry.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

The present disclosure generally relates to gamma bus wiring techniques that provide for space savings due to reduced wiring. In one embodiment, wires that include various analog voltage values may be routed from a resistor string to a number of different multiplexers such that each multiplexer output may be a multiplexed signal that may represent one of the various analog voltage values wired from the resistor string to the multiplexers. Each multiplexer output signal may be buffered using a gamma bus amplifier that is wired to a unit source driver.

In certain embodiments, a voltage offset associated with each gamma bus amplifier may reduce at least some of the visual performance characteristics of the attached display when it transitions between two analog voltage values provided by two different gamma bus amplifiers. In one embodiment, the voltage offsets associated with the gamma bus amplifiers may be distributed between the two multiplexers that correspond to the two amplifiers that cause the visual performance issues by interlacing the wires routed from the resistor string to the two multiplexers. As a result, the voltage offsets inherent in the two gamma bus amplifiers are distributed between all of the analog voltage values in the corresponding multiplexers. Consequently, a human eye's natural tendency to average proximate visual data cancels out the voltage offsets associated with the two gamma bus amplifiers, thereby canceling the adverse visual performance effects of the offsets in the two gamma bus amplifiers.

BRIEF DESCRIPTION OF THE DRAWINGS

Various aspects of this disclosure may be better understood upon reading the following detailed description and upon reference to the drawings in which.

DETAILED DESCRIPTION OF SPECIFIC EMBODIMENTS

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

The present disclosure generally relates to gamma bus wiring techniques that may be used to save space in the display. Gamma block driving circuitry may be used to provide different analog voltage levels to a pixel of a LCD display, thereby producing different digital luminance levels (i.e., gray levels) within the pixel. In certain embodiments, gamma block driving circuitry may employ multiplexers and gamma bus amplifiers to reduce the number of wires coupled to the unit source driver of each pixel in a LCD display, thereby saving space in the display.

Figure 1:
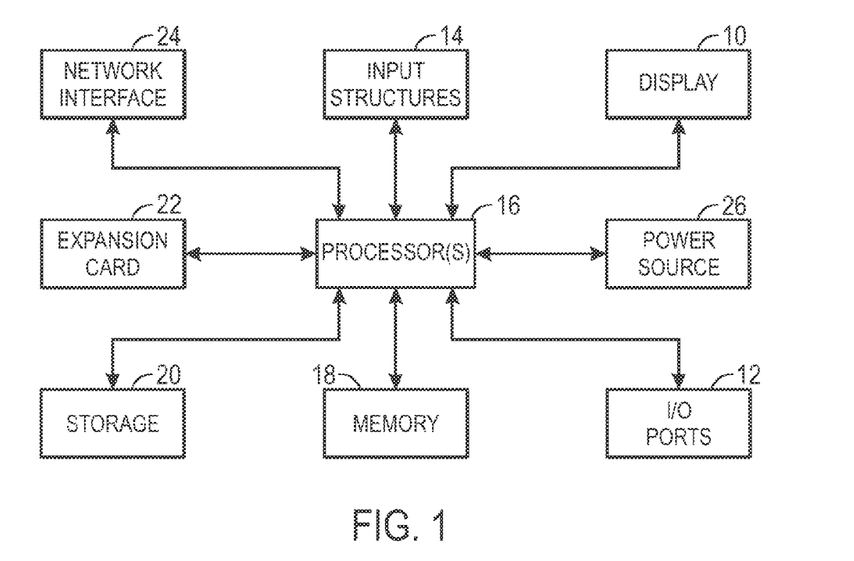
FIG. 1 is a block diagram of exemplary components of an electronic device, in accordance with aspects of the present disclosure.
Figure 2:
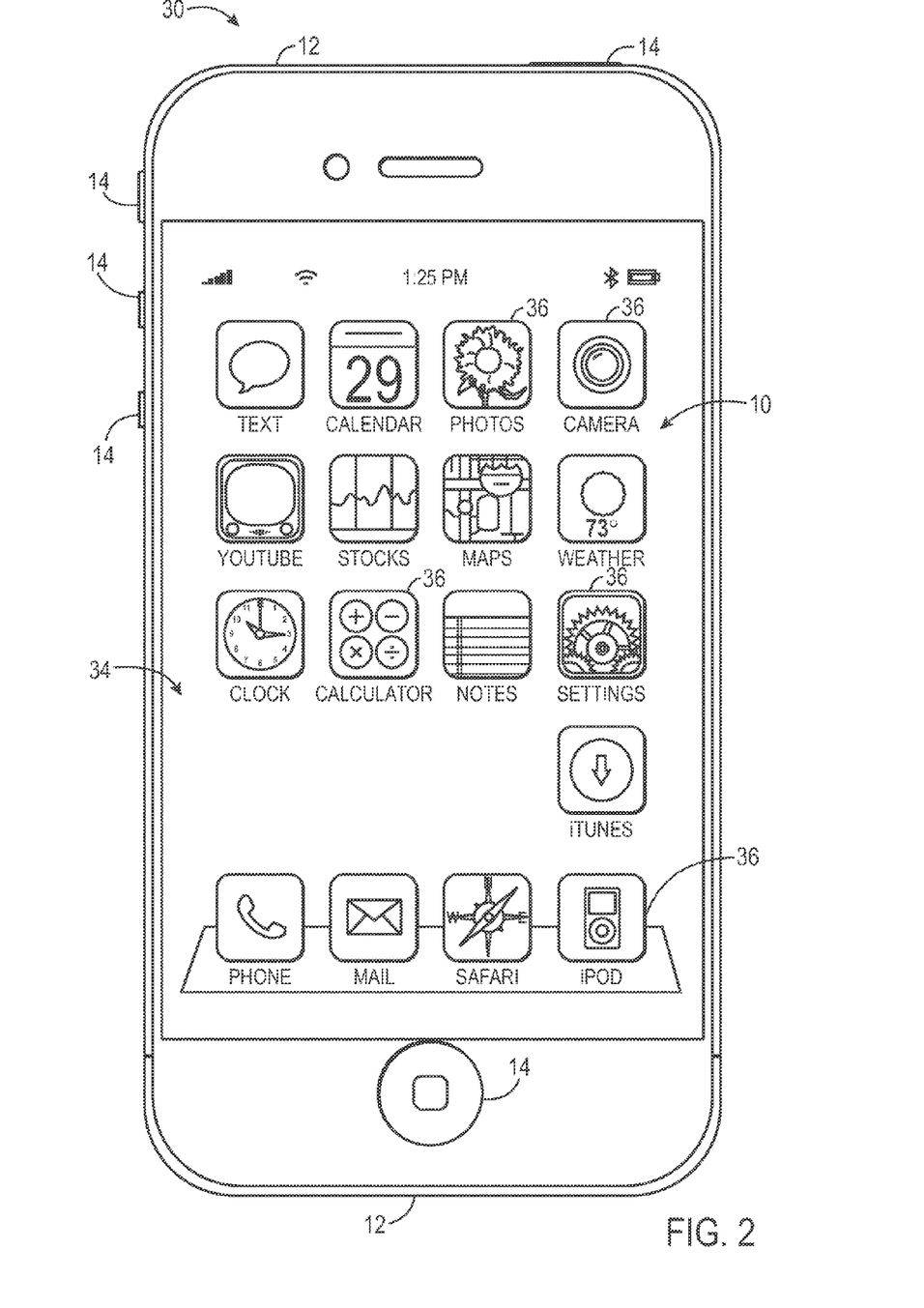
FIG. 2 is a front view of a handheld electronic device in accordance with aspects of the present disclosure.
Figure 3:
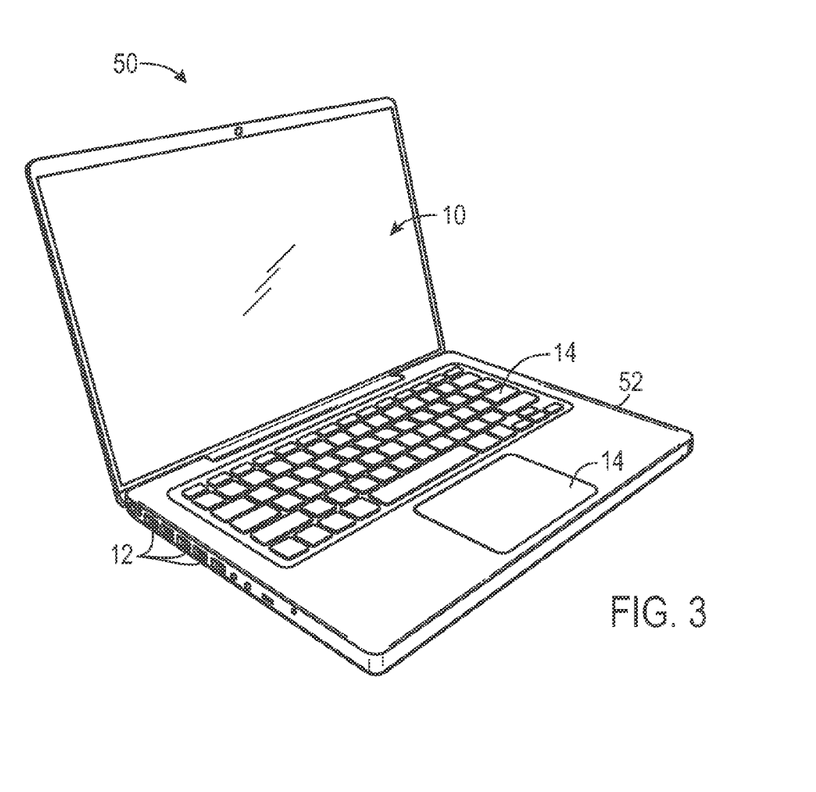
FIG. 3 is a view of a computer in accordance with aspects of the present disclosure.

With these foregoing features in mind, a general description of suitable electronic devices using LCD displays having such gamma block driving circuitry is provided below. In FIG. 1, a block diagram depicting various components that may be present in electronic devices suitable for use with the present techniques is provided. In FIG. 2, one example of a suitable electronic device, here provided as a handheld electronic device, is depicted. In FIG. 3, another example of a suitable electronic device, here provided as a computer system, is depicted. These types of electronic devices, and other electronic devices providing comparable display capabilities, may be used in conjunction with the present techniques.

An example of a suitable electronic device may include various internal and/or external components, which contribute to the function of the device.

FIG. 1 is a block diagram illustrating the components that may be present in such an electronic device 8 and which may allow the device 8 to function in accordance with the techniques discussed herein. Those of ordinary skill in the art will appreciate that the various functional blocks shown in FIG. 1 may comprise hardware elements (including circuitry), software elements (including computer code stored on a computer-readable medium) or a combination of both hardware and software elements. It should further be noted that FIG. 1 is merely one example of a particular implementation and is merely intended to illustrate the types of components that may be present in a device 8. For example, in the presently illustrated embodiment, these components may include a display 10, I/O ports 12, input structures 14, one or more processors 16, a memory device 18, a non-volatile storage 20, expansion card(s) 22, a networking device 24, and a power source 26.

With regard to each of these components, the display 10 may be used to display various images generated by the device 8. In one embodiment, the display 10 may be a liquid crystal display (LCD). For example, the display 10 may be an LCD employing fringe field switching (FFS), in-plane switching (IPS), or other techniques useful in operating such LCD devices. Additionally, in certain embodiments of the electronic device 8, the display 10 may be provided in conjunction with touch-sensitive element, such as a touch screen, that may be used as part of the control interface for the device 8.

The I/O ports 12 may include ports configured to connect to a variety of external devices, such as a power source, headset or headphones, or other electronic devices (such as handheld devices and/or computers, printers, projectors, external displays, modems, docking stations, and so forth). The input structures 14 may include the various devices, circuitry, and pathways by which user input or feedback is provided to the processor 16. Such input structures 14 may be configured to control a function of the device 8, applications running on the device 8, and/or any interfaces or devices connected to or used by the electronic device 8.

In certain embodiments, an input structure 14 and display 10 may be provided together, such an in the case of a touch screen where a touch sensitive mechanism is provided in conjunction with the display 10. In such embodiments, the user may select or interact with displayed interface elements via the touch sensitive mechanism. In this way, the displayed interface may provide interactive functionality, allowing a user to navigate the displayed interface by touching the display 10.

The processor(s) 16 may provide the processing capability to execute the operating system, programs, user and application interfaces, and any other functions of the electronic device 8. The processor(s) 16 may include one or more microprocessors, such as one or more "general-purpose" microprocessors, one or more special-purpose microprocessors, graphics processing units (GPUs), and/or ASICS, or some combination of such processing components.

The instructions or data to be processed by the processor(s) 16 may be stored in a computer-readable medium, such as a memory 18. Such a memory 18 may be provided as a volatile memory, such as random access memory (RAM), and/or as a non-volatile memory, such as read-only memory (ROM). The components may further include other forms of computer-readable media, such as a non-volatile storage 20, for persistent storage of data and/or instructions. The non-volatile storage 20 may include flash memory, a hard drive, or any other optical, magnetic, and/or solid-state storage media. The non-volatile storage 20 may be used to store firmware, data files, software, wireless connection information, and any other suitable data.

The embodiment illustrated in FIG. 1 may also include one or more card or expansion slots. The card slots may be configured to receive an expansion card 22 that may be used to add functionality, such as additional memory, I/O functionality, or networking capability, to the electronic device 8. The components depicted in FIG. 1 also include a network device 24, such as a network controller or a network interface card (NIC). In one embodiment, the network device 24 may be a wireless NIC providing wireless connectivity over any 802.11 standard or any other suitable wireless networking standard. In another embodiment, the network device 24 may be a Wi-Fi device, a radio frequency device, a Bluetooth® device, a cellular communication device, or the like. The network device 24 may allow the electronic device 8 to communicate over a network, such as a Local Area Network (LAN), Wide Area Network (WAN), or the Internet.

Further, the components may also include a power source 26. In one embodiment, the power source 26 may be one or more batteries, such as a lithium-ion polymer battery or other type of suitable battery. The battery may be user-removable or may be secured within the housing of the electronic device 8, and may be rechargeable. Additionally, the power source 26 may include AC power, such as provided by an electrical outlet, and the electronic device 8 may be connected to the power source 26 via a power adapter. This power adapter may also be used to recharge one or more batteries if present.

With the foregoing in mind, FIG. 2 illustrates an electronic device 8 in the form of a handheld device 30, here a cellular telephone. It should be noted that while the depicted handheld device 30 is provided in the context of a cellular telephone, other types of handheld devices (such as media players for playing music and/or video, personal data organizers, handheld game platforms, and/or combinations of such devices) may also be suitably provided as the electronic device 8. Further, a suitable handheld device 30 may incorporate the functionality of one or more types of devices, such as a media player, a cellular phone, a gaming platform, a personal data organizer, and so forth.

For example, in the depicted embodiment, the handheld device 30 is in the form of a cellular telephone that may provide various additional functionalities (such as the ability to take pictures, record audio and/or video, listen to music, play games, and so forth). As discussed with respect to the general electronic device of FIG. 1, the handheld device 30 may allow a user to connect to and communicate through the Internet or through other networks, such as local or wide area networks. The handheld electronic device 30, may also communicate with other devices using short-range connections, such as Bluetooth and near field communication. By way of example, the handheld device 30 may be a model of an iPod®, iPad®, or iPhone® available from Apple Inc. of Cupertino, Calif.

In the depicted embodiment, the handheld device 30 includes an enclosure or body that protects the interior components from physical damage and shields them from electromagnetic interference. The enclosure may be formed from any suitable material such as plastic, metal or a composite material and may allow certain frequencies of electromagnetic radiation to pass through to wireless communication circuitry within the handheld device 30 to facilitate wireless communication.

In the depicted embodiment, the enclosure includes user input structures 14 through which a user may interface with the device. Each user input structure 14 may be configured to help control a device function when actuated.

In the depicted embodiment, the handheld device 30 includes a display 10 in the form of an LCD. The display 10 may be used to display a graphical user interface (GUI) 34 that allows a user to interact with the handheld device 30. The GUI 34 may include various layers, windows, screens, templates, or other graphical elements that may be displayed in all, or a portion, of the display 10. Generally, the GUI 34 may include graphical elements that represent applications and functions of the electronic device. The graphical elements may include icons 36 and other images representing buttons, sliders, menu bars, and the like. The icons 36 may correspond to various applications of the electronic device that may open upon selection of a respective icon 36. Furthermore, selection of an icon 36 may lead to a hierarchical navigation process, such that selection of an icon 36 leads to a screen that includes one or more additional icons or other GUI elements. The icons 36 may be selected via a touch screen included in the display 10, or may be selected by a user input structure 14, such as a wheel or button.

The handheld electronic device 30 also may include various input and output (I/O) ports 12 that allow connection of the handheld device 30 to external devices. For example, one I/O port 12 may be a port that allows the transmission and reception of data or commands between the handheld electronic device 30 and another electronic device, such as a computer. Such an I/O port 12 may be a proprietary port from Apple Inc. or may be an open standard I/O port.

In addition to handheld devices 30, such as the depicted cellular telephone of FIG. 2, an electronic device 8 may also take the form of a computer or other type of electronic device. Such computers may include computers that are generally portable (such as laptop, notebook, and tablet computers) as well as computers that are generally used in one place (such as conventional desktop computers, workstations, and/or servers). In certain embodiments, the electronic device 8 in the form of a computer may be a model of a MacBook®, MacBook® Pro, MacBook Air®, iMac®, Mac® mini, iPad® or Mac Pro® available from Apple Inc. By way of example, an electronic device 8 in the form of a laptop computer 50 is illustrated in FIG. 3 in accordance with one embodiment. The depicted computer 50 includes a housing 52, a display 10 (such as an LCD), input structures 14, and input/output ports 12.

In one embodiment, the input structures 14 (such as a keyboard and/or touchpad) may be used to interact with the computer 50, such as to start, control, or operate a GUI or applications running on the computer 50. For example, a keyboard and/or touchpad may allow a user to navigate a user interface or application interface displayed on the display 10.

As depicted, the electronic device 8 in the form of computer 50 may also include various input and output ports 12 to allow connection of additional devices. For example, the computer 50 may include an I/O port 12, such as a USB port or other port, suitable for connecting to another electronic device, a projector, a supplemental display, and so forth. In addition, the computer 50 may include network connectivity, memory, and storage capabilities, as described with respect to FIG. 1. As a result, the computer 50 may store and execute a GUI and other applications.

With the foregoing discussion in mind, it may be appreciated that an electronic device 8 in the form of either a handheld device 30 or a computer 50 may be provided with an LCD as the display 10. Such an LCD may be utilized to display the respective operating system and application interfaces running on the electronic device 8 and/or to display data, images, or other visual outputs associated with an operation of the electronic device 8.

In embodiments in which the electronic device 8 includes an LCD, display 10 may include an array or matrix of picture elements (i.e., pixels). In operation, display 10 generally operates to modulate the transmission of light through the pixels by controlling the orientation of liquid crystal disposed at each pixel. In general, the orientation of the liquid crystals is controlled by a varying an electric field associated with each respective pixel, with the liquid crystals being oriented at any given instant by the properties (strength, shape, and so forth) of the electric field.

Different types of LCDs may employ different techniques in manipulating these electrical fields and/or the liquid crystals. For example, certain LCDs employ transverse electric field modes in which the liquid crystals are oriented by applying an electrical field that is generally in-plane to a layer of the liquid crystals. Example of such techniques include in-plane switching (IPS) and fringe field switching (FFS) techniques, which differ in the electrode arrangement employed to generate the respective electrical fields.

While control of the orientation of the liquid crystals in such displays may be sufficient to modulate the amount of light emitted by a pixel, color filters may also be associated with the pixels to allow specific colors of light to be emitted by each pixel. For example, in embodiments where display 10 is a color display, each pixel of a group of pixels may correspond to a different primary color. For example, in one embodiment, a group of pixels may include a red pixel, a green pixel, and a blue pixel, each associated with an appropriately colored filter. The intensity of light allowed to pass through each pixel (by modulation of the corresponding liquid crystals), and its combination with the light emitted from other adjacent pixels, determines what color(s) are perceived by a user viewing the display. As the viewable colors are formed from individual color components (e.g., red, green, and blue) provided by the colored pixels, the colored pixels may also be referred to as unit pixels.

Figure 4:
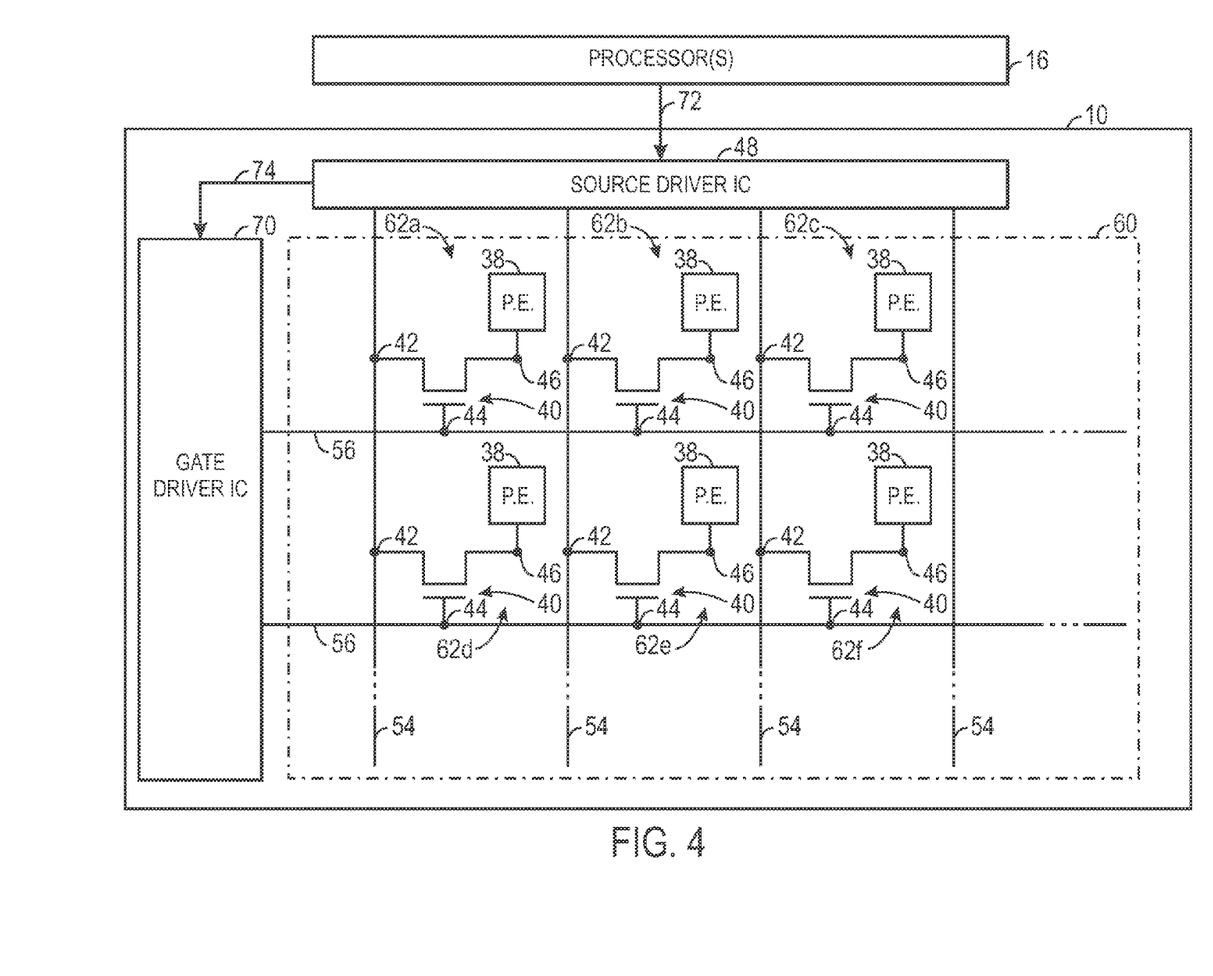
FIG. 4 is a circuit diagram illustrating an example of switching and display circuitry that may be included in the display device of FIG. 1, in accordance with aspects of the present disclosure.

As mentioned above, the orientation of the liquid crystals is generally controlled by a varying an electric field associated with each respective pixel in the display 10. Keeping this in mind, FIG. 4 illustrates one embodiment of a circuit diagram of display 10 that may generate the electrical field that energizes each respective pixel and causes each respective pixel to emit light at an intensity corresponding to an applied voltage. As shown, display 10 may include display panel 60. Display panel 60 may include a plurality of unit pixels 62 disposed in a pixel array or matrix defining a plurality of rows and columns of unit pixels that collectively form an image viewable region of display 10. In such an array, each unit pixel 62 may be defined by the intersection of rows and columns, represented here by the illustrated gate lines 56 (also referred to as "scanning lines") and source lines 54 (also referred to as "data lines"), respectively.

Although only six unit pixels, referred to individually by the reference numbers 62a-62f, respectively, are shown in the present example for purposes of simplicity, it should be understood that in an actual implementation, each source line 54 and gate line 56 may include hundreds or even thousands of unit pixels. By way of example, in a color display panel 60 having a display resolution of 1024×768, each source line 54, which may define a column of the pixel array, may include 768 unit pixels, while each gate line 56, which may define a row of the pixel array, may include 1024 groups of unit pixels, wherein each group includes a red, blue, and green pixel, thus totaling 3072 unit pixels per gate line 56. As mentioned above, in the context of LCDs, the color of a particular unit pixel generally depends on a particular color filter that is disposed over a liquid crystal layer of the unit pixel. In the presently illustrated example, the group of unit pixels 62a-62c may represent a group of pixels having a red pixel (62a), a blue pixel (62b), and a green pixel (62c). The group of unit pixels 62d-62f may be arranged in a similar manner.

As shown in the present figure, each unit pixel 62a-62f includes a thin film transistor (TFT) 40 for switching a respective pixel electrode 38. In the depicted embodiment, the source 42 of each TFT 40 may be electrically connected to a source line 54. Similarly, the gate 44 of each TFT 40 may be electrically connected to a gate line 56. Furthermore, the drain 46 of each TFT 40 may be electrically connected to a respective pixel electrode 38. Each TFT 40 serves as a switching element which may be activated and deactivated (e.g., turned on and off) for a predetermined period based upon the respective presence or absence of a scanning signal at gate 44 of TFT 40. For instance, when activated, TFT 40 may store the image signals received via a respective source line 54 as a charge in pixel electrode 38. The image signals stored by pixel electrode 38 may be used to generate an electrical field that energizes the respective pixel electrode 38 and causes the pixel 62 to emit light at an intensity corresponding to the voltage applied by the source line 54. For instance, in an LCD panel, such an electrical field may align liquid crystals molecules within a liquid crystal layer to modulate light transmission through the liquid crystal layer.

Display 10 may further include source driver integrated circuit (source driver IC) 48, which may include a chip, such as a processor or ASIC, that is configured to control various aspects of display 10 and panel 60. For example, source driver IC 48 may receive image data 72 from processor(s) 16 and send corresponding image signals to unit pixels 62a-62f of panel 60. Source driver IC 48 may also be coupled to gate driver IC 70, which may be configured to activate or deactivate pixels 62 via gate lines 56. As such, source driver IC 48 may send timing information, shown here by reference number 74, to gate driver IC 70 to facilitate activation/deactivation of individual rows of pixels 62. While the illustrated embodiment shows a single source driver IC 48 coupled to panel 60 for purposes of simplicity, it should be appreciated that additional embodiments may utilize a plurality of source driver ICs 48. For example, additional embodiments may include a plurality of source driver ICs 48 disposed along one or more edges of panel 60, wherein each source driver IC 48 is configured to control a subset of source lines 54 and/or gate line 56. Further, although gate driver IC 70 is illustrated in FIG. 4 as a separate integrated circuit, it should be noted that in some embodiments the gate driver may be disposed within a layer, such as a glass panel, of the display 10, as opposed to being a separate integrated circuit.

In operation, source driver IC 48 receives image data 72 from processor 16 and, based on the received data, outputs signals to control pixels 62. To display image data 72, source driver IC 48 may adjust the voltage of pixel electrodes 38 (abbreviated in FIG. 4 as P.E.) one row at a time. To access an individual row of pixels 62, gate driver IC 70 may send an activation signal to TFTs 40 associated with the particular row of pixels 62 being addressed. This activation signal may render the TFTs 40 on the addressed row conductive. Accordingly, image data 72 corresponding to the addressed row may be transmitted from source driver IC 48 to each of the unit pixels 62 within the addressed row via respective data lines 54. Thereafter, gate driver IC 70 may deactivate TFTs 40 in the addressed row, thereby impeding the pixels 62 within that row from changing state until the next time they are addressed. The above-described process may be repeated for each row of pixels 62 in panel 60 to reproduce image data 72 as a viewable image on display 10.

In sending image data to each of the pixels 62, a digital image is typically converted into numerical data so that it can be interpreted by a display device. For instance, the image 72 may itself be divided into small "pixel" portions, each of which may correspond to a respective pixel 62 of panel 60. To avoid confusion with the physical unit pixels 62 of the panel 60, the pixel portions of the image 72 shall be referred to herein as "image pixels." Each "image pixel" of image 72 may be associated with a numerical value, which may be referred to as a "data number" or a "digital luminance level," that quantifies the luminance intensity (e.g., brightness or darkness) of the image 72 at a particular spot. The digital level value of each image pixel typically represents a shade of darkness or brightness between black and white, commonly referred to as gray levels. As will be appreciated, the number of gray levels in an image usually depends on the number of bits used to represent pixel intensity levels in a display device, which may be expressed as $2^N$ gray levels, where N is the number of bits used to express a digital level value. By way of example, in an embodiment where display 10 is a "normally black" display using 8 bits to represent a digital level, display 10 may be capable of providing 256 gray levels to display an image, wherein a digital level of 0 corresponds to full black (e.g., no transmittance), and a digital level of 255 correspond to full white (e.g., full transmittance). In another embodiment, if 6 bits are used to represent a digital level, then 64 gray levels may be available for displaying an image.

To provide some examples, in one embodiment, source driver IC 48 may receive an image data stream equivalent to 24 bits of data, with 8-bits of the image data stream corresponding to a digital level for each of the red, green, and blue color channels corresponding to a pixel group including red, green, and blue unit pixel (e.g., 62a-62c or 62d-62f). In another embodiment, source driver IC 48 may receive 18-bits of data in an image data stream, with 6-bits of the image data corresponding to each of the red, green, and blue color channels, for example. Further, although digital levels corresponding to luminance are generally expressed in terms of gray levels, where a display utilizes multiple color channels (e.g., red, green, blue), the portion of the image corresponding to each color channel may be individually expressed as in terms of such gray levels. Accordingly, while the digital level data for each color channel may be interpreted as a grayscale image, when processed and displayed using unit pixels 62 of panel 60, color filters (e.g., red, blue, and green) associated with each unit pixel 62 allows the image to be perceived as a color image.

Figure 5:
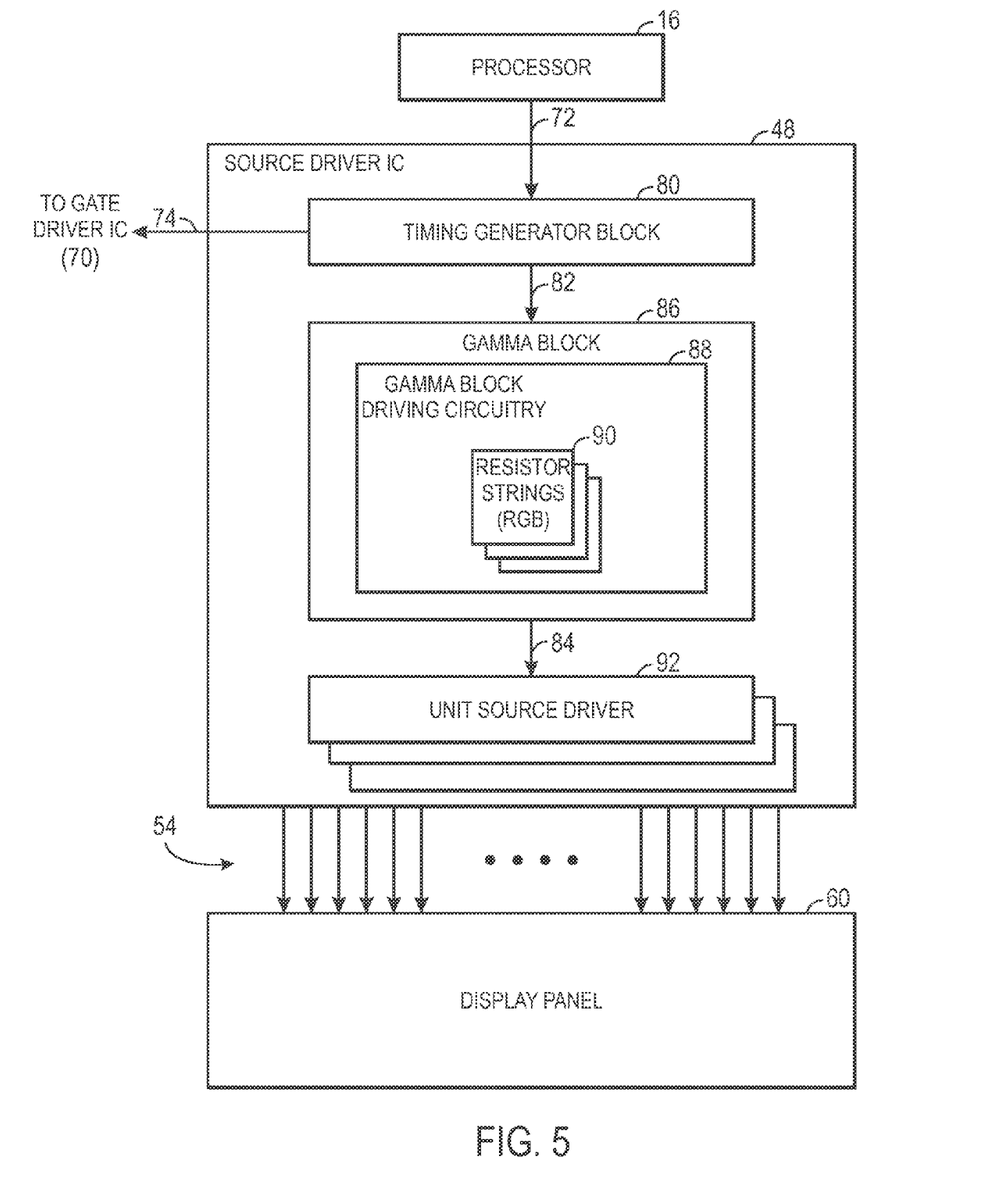
FIG. 5 is a block diagram showing a processor and an example of a source driver integrated circuit (IC) of FIG. 4, in accordance with aspects of the present disclosure.

Continuing now to FIG. 5, a more detailed block diagram of source driver IC 48 is illustrated. As shown, source driver IC 48 may include various logic blocks for processing image data 72 received from processor 16, including timing generator block 80, gamma block 86, and unit source driver 92. Timing generator block 80 may generate appropriate timing signals for controlling source driver IC 48 and gate driver IC 70. For instance, timing generator block 80 may control the transmission of image data 72 to gamma block 86. By way of example, timing generator block 80 may provide a portion 82 of image data 72 to gamma block 86 in a timed manner. For instance, portion 82 of image data 72 may represent image signals transmitted in line-sequence via a predetermined timing. Timing generator block 80 may additionally provide appropriate timing signals 74 to gate driver IC 70, such that scanning signals along gate lines 56 (FIG. 4) may be applied by line sequence with a predetermined timing and/or in a pulsed manner to appropriate rows of unit pixels 62.

Gamma block 86 includes gamma block driving circuitry 88 that may be utilized to provide different analog voltage levels to each unit pixel in a LCD display. As such, gamma block driving circuitry 88 may include a resistor string 90 for each unit pixel in the LCD display. To provide different pixel intensity levels for each unit pixel, each resistor string 90 may produce a predetermined number of analog voltage levels 84 that corresponds to a number of different pixel intensity levels that may be displayed in the unit pixel. In one embodiment, the predetermined number of analog voltage levels 84 provided by the resistor string 90 may depend on the number of bits used to represent the pixel intensity levels. For example, if 8 bits are used to represent the intensity levels of a unit pixel, then 256 total analog voltage levels ($V_0$-$V_{255}$) may be provided by the resistor string 90 to produce 256 gray levels in the unit pixel.

Traditionally, all of the analog voltage levels 84 output from resistor string 90 are directly coupled to a unit source driver 92. In addition to receiving all of the analog voltage levels from the resistor string 90, the unit source driver 92 may receive a digital luminance level (i.e., pixel intensity level) to be displayed in its pixel. After receiving the digital luminance level, the unit source driver 92 may determine which one of the analog voltage levels 84 from the resistor string 90 corresponds to the received digital luminance level and then output the corresponding analog voltage level 84 to display panel 60 by way of source lines 54.

Figure 6:
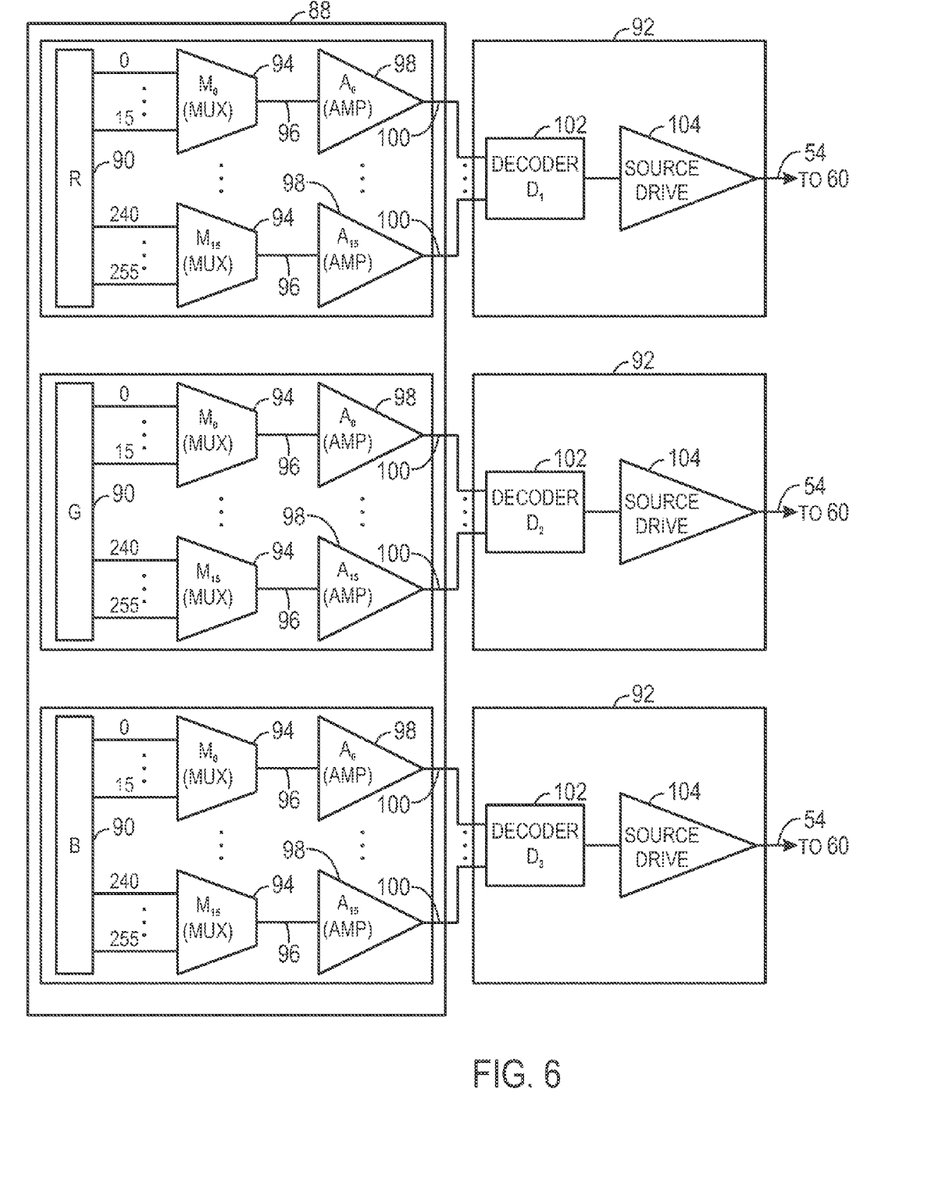
FIG. 6 is a wiring diagram of a gamma block and a unit source driver, in accordance with aspects of the present disclosure.

To reduce the number of wires routed between the resistor string 90 and the unit source driver 92, gamma block driving circuitry 88 may route all of its analog voltage levels 84 from resistor string 90 to a predetermined number of multiplexers 94. FIG. 6 illustrates an example of a wiring diagram for gamma block driving circuitry 88 that drives 8-bit pixels (i.e., 256 digital luminance levels). As such, each multiplexer 94 may receive a portion of all of the 256 analog voltage levels and output each of its received analog voltage levels as a time multiplexed signal 96. For instance, multiplexer $M_0$ may receive analog voltage levels $V_0$-$V_{15}$ and output each voltage level for a predetermined time increment (e.g., 2 us) such that the single multiplexer output 96 for multiplexer $M_0$ may include 16 voltage level ramps that correspond to the 16 analog voltage levels $V_0$-$V_{15}$. Each multiplexer output 96 may then be buffered using a gamma bus amplifier 98. The analog voltage levels associated with each gamma bus amplifier 98 are shown in Table 1 below.

TABLE 1

Gamma Bus Amplifier Voltage Levels

| Gamma Bus Amplifier | From Voltage Level | To Voltage Level |
|---|---|---|
| $A_0$ | $V_0$ | $V_{15}$ |
| $A_1$ | $V_{16}$ | $V_{31}$ |
| $A_2$ | $V_{32}$ | $V_{47}$ |
| $A_3$ | $V_{48}$ | $V_{63}$ |
| $A_4$ | $V_{64}$ | $V_{79}$ |
| $A_5$ | $V_{80}$ | $V_{95}$ |
| $A_6$ | $V_{96}$ | $V_{111}$ |
| $A_7$ | $V_{112}$ | $V_{127}$ |
| $A_8$ | $V_{128}$ | $V_{143}$ |
| $A_9$ | $V_{144}$ | $V_{159}$ |
| $A_{10}$ | $V_{160}$ | $V_{175}$ |
| $A_{11}$ | $V_{176}$ | $V_{191}$ |
| $A_{12}$ | $V_{192}$ | $V_{207}$ |
| $A_{13}$ | $V_{208}$ | $V_{223}$ |
| $A_{14}$ | $V_{224}$ | $V_{239}$ |
| $A_{15}$ | $V_{240}$ | $V_{255}$ |

As mentioned above, the gamma bus amplifiers 98 may buffer each multiplexer output signal 96 thereby generating a buffered multiplexed signal 100 for each multiplexer 94. The buffered multiplexed signal 100 may then be wired to unit source driver 92 that may include a decoder 102 and a source driver 104. Decoder 102 may receive the buffered multiplexed signal 100 and an input signal (not shown) that denotes a gray level to be displayed on its corresponding pixel. In one embodiment, the input signal may select one of the buffered multiplexed signals 100 received by the decoder 102 and one of the analog voltage levels in the multiplexer 94 that corresponds to the selected buffered multiplexed signal 100. In one embodiment, the most significant bits of the received input signal may represent one of the buffered multiplexed signals 100, and the least significant bits of the received input signal may represent a desired analog voltage level of the corresponding multiplexer output 96. Accordingly, the decoder 102 may determine a time window for the buffered multiplexed signal 100 that corresponds to the desired analog voltage level. The decoder 102 may then output the voltage level ramp in the buffered multiplexed signal 100 that corresponds to the desired analog voltage level based on the determined time window to the source driver 104, which may then output the corresponding analog voltage level 84 to the display panel 60 by way of source lines 54.

By using the multiplexers 94 and the gamma bus amplifiers 98 as shown in FIG. 6, the gamma block 86 requires fewer wires between its resistor strings 90 and unit source drivers 92. Considering that each unit pixel (or sub-pixel) in a display uses a resistor string 90 and a unit source driver 92, it becomes apparent that the total number of wires in the source driver IC 48 is drastically reduced by employing multiplexers 94 and the gamma bus amplifiers 98. As a result, the source driver IC 48 design may become smaller (e.g., reduced in height) which may allow for thinner LCD displays, edge/bezel, electronic devices, and the like.

Although the wiring diagram illustrated in FIG. 6 allows for a smaller source driver IC 48, the connected display panel 60 may experience various visual performance issues due to the gamma bus amplifiers 98. Some visual performance issues may include visible banding when the display panel 60 receives an analog voltage level from one gamma bus amplifier and then transitions to an analog voltage level from a different gamma bus amplifier. The visual performance issues may occur due to a voltage offset that is inherent in each gamma bus amplifier 98. That is, each multiplexer output 96 may experience a voltage offset as it passes through the gamma bus amplifier 98 due to the voltage offset inherently within each gamma bus amplifier 98. Unfortunately, the voltage offset of each gamma bus amplifier 98 may alter the voltage ramps in the multiplexer output 96 such that the required analog voltage levels are not received by the pixels in the display panel 60.

In general, these visual performance issues occur when a pixel transitions between middle gray levels. For example, in an 8-bit display (i.e., 256 gray levels), the visual performance issues (e.g., visible banding) most commonly occur when a unit pixel changes from gray level 127 (i.e., voltage level 127) to gray level 128 (i.e., voltage level 128). Referring back to Table 1, it is apparent that the display panel 60 receives voltage level 127 ($V_{127}$) from gamma bus amplifier $A_7$ and voltage level 128 ($V_{128}$) from gamma bus amplifier $A_8$. The visible banding may occur here because the voltage step size required to change from gray level 127 to gray level 128 is so small that the voltage offset inherent in gamma bus amplifier $A_8$ is sufficient to alter the voltage level ramps received by the gamma bus amplifier $A_8$ and cause gray scale inversion. That is, the resulting analog voltage level received by the unit pixel is not sufficient to change gray levels or becomes monotonic.

To further clarify the above described gray scale inversion effect, Tables 2-3 depict the analog voltage levels as received by a 4-bit pixel for ideal gamma bus amplifiers with no voltage offsets and analog voltage levels as received by a 4-bit pixel for actual gamma bus amplifiers with +/−10 mV voltage offsets. It should be noted that Tables 2-3 are provided below to further clarify some of the above described visual performance issues using a simplified 4-bit pixel example and is not intended to limit the scope of the techniques described herein to 4-bit pixels. As such, it should be understood that the techniques described herein may be used on display panels having 4-bit pixels, 6-bit pixels, 8-bit pixels and the like.

TABLE 2

Voltage Steps with Zero-Offset Gamma Bus Amplifiers

| Gray Level | Postive Gamma Voltage Level | Negative Gamma Voltage Level | AMP A0 Offest: 0 mV | AMP A1 Offest: 0 mV | A0 −> A1 Positive Gamma Actual Voltage Level | A1 −> A0 Negative Gamma Actual Voltage Level | Positive Ideal DNL | Negative Ideal DNL | Average Ideal DNL |
|---|---|---|---|---|---|---|---|---|---|
| 0 | 1 | 4 | 0 | | 1 | 4 | | | |
| 1 | 1.2 | 3.8 | 1 | | 1.2 | 3.8 | 0.2 | 0.2 | 0.2 |
| 2 | 1.4 | 3.6 | 2 | | 1.4 | 3.6 | 0.2 | 0.2 | 0.2 |
| 3 | 1.6 | 3.4 | 3 | | 1.6 | 3.4 | 0.2 | 0.2 | 0.2 |
| 4 | 1.8 | 3.2 | 4 | | 1.8 | 3.2 | 0.2 | 0.2 | 0.2 |
| 5 | 2 | 3 | 5 | | 2 | 3 | 0.2 | 0.2 | 0.2 |
| 6 | 2.2 | 2.8 | 6 | | 2.2 | 2.8 | 0.2 | 0.2 | 0.2 |
| 7 | 2.4 | 2.6 | 7 | | 2.4 | 2.6 | 0.2 | 0.2 | 0.2 |
| 8 | 2.6 | 2.4 | | 8 | 2.6 | 2.4 | 0.2 | 0.2 | 0.2 |
| 9 | 2.8 | 2.2 | | 9 | 2.8 | 2.2 | 0.2 | 0.2 | 0.2 |
| 10 | 3 | 2 | | 10 | 3 | 2 | 0.2 | 0.2 | 0.2 |
| 11 | 3.2 | 1.8 | | 11 | 3.2 | 1.8 | 0.2 | 0.2 | 0.2 |
| 12 | 3.4 | 1.6 | | 12 | 3.4 | 1.6 | 0.2 | 0.2 | 0.2 |
| 13 | 3.6 | 1.4 | | 13 | 3.6 | 1.4 | 0.2 | 0.2 | 0.2 |
| 14 | 3.8 | 1.2 | | 14 | 3.8 | 1.2 | 0.2 | 0.2 | 0.2 |
| 15 | 4 | 1 | | 15 | 4 | 1 | 0.2 | 0.2 | 0.2 |

TABLE 3

Voltage Steps with Offset Gamma Bus Amplifiers

| Gray Level | Positive Voltage Level | Negative Voltage Level | AMP A0 Offest: 10 mV | AMP A1 Offest: −10 mV | A0 −> A1 Positive Gamma Actual Voltage Level | A1 −> A0 Negative Gamma Actual Voltage Level | Positive Actual DNL | Negative Actual DNL | Average DNL |
|---|---|---|---|---|---|---|---|---|---|
| 0 | 1 | 4 | 0 | | 1.01 | 3.99 | | | |
| 1 | 1.2 | 3.8 | 1 | | 1.21 | 3.79 | 0.2 | 0.2 | 0.2 |
| 2 | 1.4 | 3.6 | 2 | | 1.41 | 3.59 | 0.2 | 0.2 | 0.2 |
| 3 | 1.6 | 3.4 | 3 | | 1.61 | 3.39 | 0.2 | 0.2 | 0.2 |
| 4 | 1.8 | 3.2 | 4 | | 1.81 | 3.19 | 0.2 | 0.2 | 0.2 |
| 5 | 2 | 3 | 5 | | 2.01 | 2.99 | 0.2 | 0.2 | 0.2 |
| 6 | 2.2 | 2.8 | 6 | | 2.21 | 2.79 | 0.2 | 0.2 | 0.2 |
| 7 | 2.4 | 2.6 | 7 | | 2.41 | 2.59 | 0.2 | 0.2 | 0.2 |
| 8 | 2.6 | 2.4 | | 8 | 2.59 | 2.41 | 0.18 | 0.18 | 0.18 |
| 9 | 2.8 | 2.2 | | 9 | 2.79 | 2.21 | 0.2 | 0.2 | 0.2 |
| 10 | 3 | 2 | | 10 | 2.99 | 2.01 | 0.2 | 0.2 | 0.2 |
| 11 | 3.2 | 1.8 | | 11 | 3.19 | 1.81 | 0.2 | 0.2 | 0.2 |
| 12 | 3.4 | 1.6 | | 12 | 3.39 | 1.61 | 0.2 | 0.2 | 0.2 |
| 13 | 3.6 | 1.4 | | 13 | 3.59 | 1.41 | 0.2 | 0.2 | 0.2 |
| 14 | 3.8 | 1.2 | | 14 | 3.79 | 1.21 | 0.2 | 0.2 | 0.2 |
| 15 | 4 | 1 | | 15 | 3.99 | 1.01 | 0.2 | 0.2 | 0.2 |

As shown above, Table 2 depicts the analog voltage levels provided to a 4-bit pixel by gamma bus amplifiers $A_0$ and $A_1$, both of which having no voltage offsets associated with them. Since gamma bus amplifiers $A_0$ and $A_1$ have no voltage offsets, the actual positive and negative gamma voltage levels output by gamma bus amplifiers $A_0$ and $A_1$ equal the positive and negative gamma voltage levels received by the gamma bus amplifiers $A_0$ and $A_1$. As a result, the differential non-linear (DNL) value and the average DNL value when transitioning between each gray level (i.e., voltage step) are uniform at 0.2V.

In contrast, Table 3 depicts the analog voltage levels provided by gamma bus amplifiers $A_0$ and $A_1$ having a +10 mV offset and a −10 mV offset, respectively. As such, the actual positive and negative gamma voltage levels output by gamma bus amplifiers $A_0$ and $A_1$ are offset by either 10 mV or −10 mV from the positive and negative gamma voltage levels received by the gamma bus amplifiers $A_0$ and $A_1$. As a result, the DNL value and the average DNL value between each gray level (i.e., voltage step) are no longer uniform. For instance, the voltage step between gray level 7 and gray level 8 is 0.18 V as opposed to the expected 0.2 V. The visual performance issues described above may occur when the display transitions from gray level 7 to gray level 8 because the voltage step size required to make this transition (e.g., 0.2 V) is no longer achieved due to the +/−10 mV offsets associated with gamma bus amplifiers $A_7$ and $A_8$. As such, the attached pixel that receives the reduced voltage step may undergo a gray scale inversion effect that causes visual performance issues on the display panel 60.

To compensate for the inherent voltage offsets in each gamma bus amplifier 94, each of the wires from resistor strings 90 to multiplexers 94 may be interlaced such that the voltage offset associated with each corresponding gamma bus amplifier 98 may be distributed throughout each corresponding gamma bus amplifier 98, thereby canceling the effect of the offset in each gamma bus amplifier 98. For instance, in the 4-bit pixel example described with reference to Tables 2-3 above, instead of wiring voltage levels 0-7 to a first multiplexer that is coupled to gamma bus amplifier $A_0$ and voltage levels 8-15 to a second multiplexer that is coupled to gamma bus amplifier $A_1$, every other voltage level may be wired to alternate multiplexers. For example, every even numbered voltage level (0, 2, 4 . . . etc.) may be wired to the first multiplexer and every odd numbered voltage level (1, 3, 5 . . . etc.) may be wired to the second multiplexer. Table 4 depicts the analog voltage level outputs of gamma bus amplifiers $A_0$ and $A_1$ having a +10 mV and a −10 mV offset after the voltage level for every gray level have been interlaced to the first and second multiplexers.

TABLE 4

Voltage Steps for Interlaced Multiplexers with Offset Gamma Bus Amplifiers

| Gray Level | Postive Gamma Voltage Level | Negative Gamma Voltage Level | AMP A0 Offest: 10 mV | AMP A0 Offest: −10 mV | A0 −> A1 Positive Gamma Actual Voltage Level | A1 −> A0 Negative Gamma Actual Voltage Level | Positive Actual DNL | Negative Actual DNL | Average DNL |
|---|---|---|---|---|---|---|---|---|---|
| 0 | 1 | 4 | 0 | | 1.01 | 4.01 | | | |
| 1 | 1.2 | 3.8 | | 1 | 1.19 | 3.79 | 0.18 | 0.22 | 0.2 |
| 2 | 1.4 | 3.6 | 2 | | 1.41 | 3.61 | 0.22 | 0.18 | 0.2 |
| 3 | 1.6 | 3.4 | | 3 | 1.59 | 3.39 | 0.18 | 0.22 | 0.2 |
| 4 | 1.8 | 3.2 | 4 | | 1.81 | 3.21 | 0.22 | 0.18 | 0.2 |
| 5 | 2 | 3 | | 5 | 1.99 | 2.99 | 0.18 | 0.22 | 0.2 |
| 6 | 2.2 | 2.8 | 6 | | 2.21 | 2.81 | 0.22 | 0.18 | 0.2 |
| 7 | 2.4 | 2.6 | | 7 | 2.39 | 2.59 | 0.18 | 0.22 | 0.2 |
| 8 | 2.6 | 2.4 | 8 | | 2.61 | 2.41 | 0.22 | 0.18 | 0.2 |
| 9 | 2.8 | 2.2 | | 9 | 2.79 | 2.19 | 0.18 | 0.22 | 0.2 |
| 10 | 3 | 2 | 10 | | 3.01 | 2.01 | 0.22 | 0.18 | 0.2 |
| 11 | 3.2 | 1.8 | | 11 | 3.19 | 1.79 | 0.18 | 0.22 | 0.2 |
| 12 | 3.4 | 1.6 | 12 | | 3.41 | 1.61 | 0.22 | 0.18 | 0.2 |
| 13 | 3.6 | 1.4 | | 13 | 3.59 | 1.39 | 0.18 | 0.22 | 0.2 |
| 14 | 3.8 | 1.2 | 14 | | 3.81 | 1.21 | 0.22 | 0.18 | 0.2 |
| 15 | 4 | 1 | | 15 | 3.99 | 0.99 | 0.18 | 0.22 | 0.2 |

As seen in Table 4, the offset voltages associated with each gamma bus amplifier ($A_0$ and $A_1$) have been distributed evenly between each of the corresponding voltage levels. As a result, the average DNL between each gray level is 0.2 V. Accordingly, a human eye may average the proximate visual data and cancel out each gamma bus amplifier's offsets.

Although the interlacing wiring technique mentioned above has been described with reference to a 4-bit pixel, it should be understood that interlacing wiring technique may be used for any type of pixel. In one embodiment, each of the 256 voltage levels in an 8-bit pixel display, as illustrated in FIG. 6, may be interlaced from each resistor string 90 to all sixteen multiplexers 94.

The visual performance issues described above most commonly occur in an 8-bit pixel display when the pixel changes from gray level 127 to gray level 128. As mentioned above, the visual performance issues for a pixel may be due to the fact that the voltage step size required to change from gray level 127 to gray level 128 is so small that the voltage step size when transitioning from gamma bus amplifier $A_7$ and gamma bus amplifier $A_8$ (FIG. 6) becomes non-negligible. That is, the voltage offsets in gamma bus amplifier $A_7$ and gamma bus amplifier $A_8$ may reduce the voltage step size output to the pixel such that the reduced voltage may not be sufficient cause the pixel to change from gray level 127 to gray level 128.

Keeping the foregoing in mind, in one embodiment, the voltage levels that correspond to gamma bus amplifier $A_7$ and gamma bus amplifier $A_8$ ($V_{112}$-$V_{143}$) for an 8-bit pixel display may be interlaced between its corresponding multiplexers (i.e., $M_7$ and $M_8$), while the remaining voltage levels may remain wired directly into its respective multiplexers. For instance, Table 5 indicates how the voltage levels for an 8-bit pixel display may be interlaced for the gamma bus amplifiers $A_7$ and $A_8$.

TABLE 5

Gamma Bus Amplifier Voltage Levels (Interlaced)

| Gamma Bus Amplifier | From Voltage Level | To Voltage Level |
|---|---|---|
| $A_0$ | $V_0$ | $V_{15}$ |
| $A_1$ | $V_{16}$ | $V_{31}$ |
| $A_2$ | $V_{32}$ | $V_{47}$ |
| $A_3$ | $V_{48}$ | $V_{63}$ |
| $A_4$ | $V_{64}$ | $V_{79}$ |
| $A_5$ | $V_{80}$ | $V_{95}$ |
| $A_6$ | $V_{96}$ | $V_{111}$ |
| $A_7$ | $V_{112}, V_{114} \ldots$ | $\ldots V_{140}, V_{142}$ |
| $A_8$ | $V_{113}, V_{115} \ldots$ | $\ldots V_{141}, V_{143}$ |
| $A_9$ | $V_{144}$ | $V_{159}$ |
| $A_{10}$ | $V_{160}$ | $V_{175}$ |
| $A_{11}$ | $V_{176}$ | $V_{191}$ |
| $A_{12}$ | $V_{192}$ | $V_{207}$ |
| $A_{13}$ | $V_{208}$ | $V_{223}$ |
| $A_{14}$ | $V_{224}$ | $V_{239}$ |
| $A_{15}$ | $V_{240}$ | $V_{255}$ |

Figure 7:
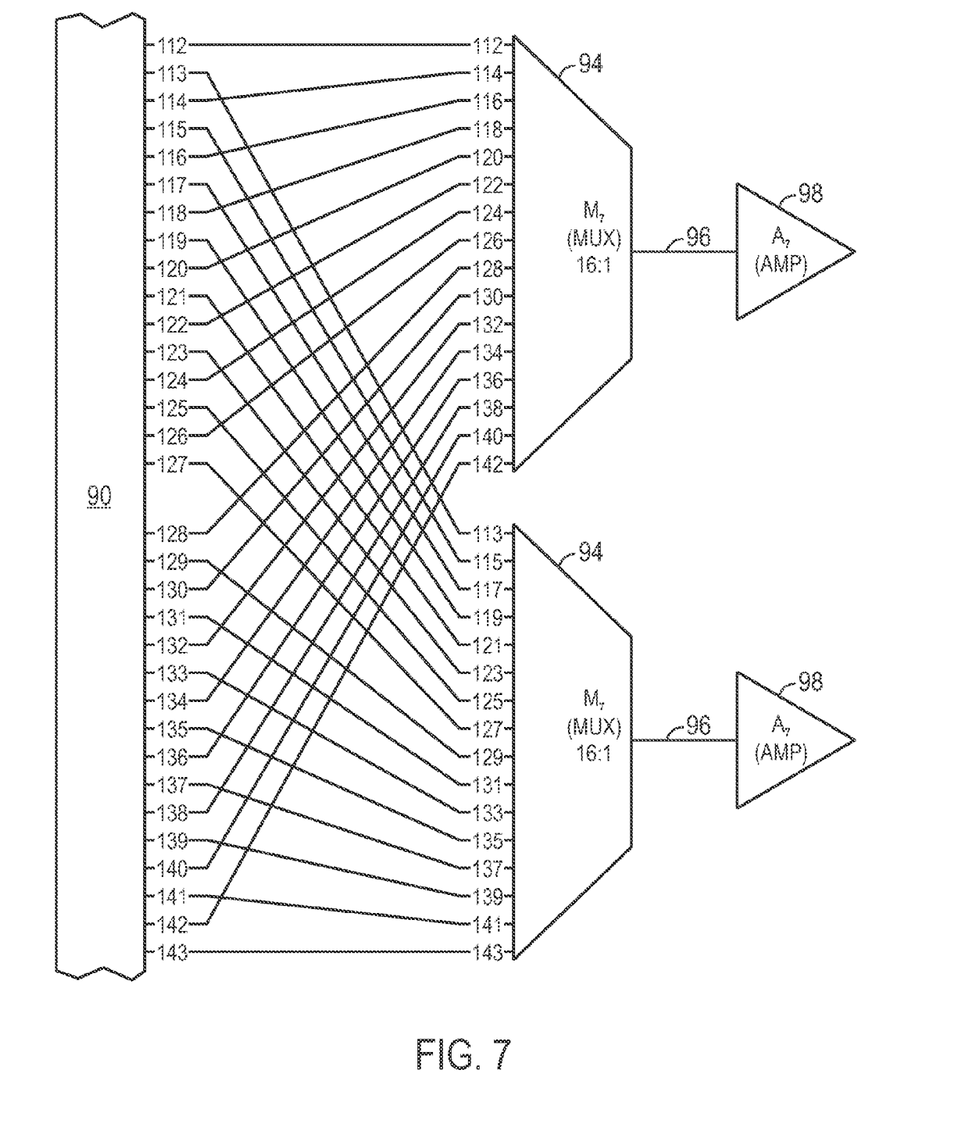
FIG. 7 is a wiring diagram of two multiplexers in the gamma block of FIG. 6, in accordance with aspects of the present disclosure.

FIG. 7 illustrates a wiring diagram for multiplexer $M_7$ and multiplexer $M_8$ as depicted in Table 5. As shown in FIG. 7, every other voltage level from resistor string 90 that is associated with gamma bus amplifiers $A_7$ and $A_8$ are wired to multiplexer $M_7$ and multiplexer $M_8$, respectively. As such, the offset voltages associated with gamma bus amplifiers $A_7$ and $A_8$ are distributed evenly between each voltage level that provided to gamma bus amplifiers $A_7$ and $A_8$. Consequently, the voltage levels output by gamma bus amplifiers $A_7$ and $A_8$ are sufficient to transition the corresponding 8-bit pixel from with gray level 127 and gray level 128 without experiencing any visual performance issues (e.g., visible banding or gray scale inversion). Accordingly, a reduced-wire source driver IC 48 may be used to improve the product design LCD display without adversely affecting its visual performance.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

What is claimed is:

1. A gamma adjustment circuitry, comprising:
    a resistor string configured to provide $2^N$ voltage levels on $2^N$ respective nodes that correspond to $2^N$ respective gray levels to be displayed in an N-bit unit pixel of a display panel;
    a set of multiplexers, wherein each multiplexer in the set of multiplexers is coupled to a respective subset of the $2^N$ respective nodes, wherein a plurality of adjacent nodes that correspond to a respective plurality of adjacent gray levels in two respective subsets of the $2^N$ respective nodes is interlaced between two respective multiplexers in the set of multiplexers;
    a set of amplifiers, wherein each amplifier in the set of amplifiers is coupled to a respective multiplexer in the set of multiplexers; and
    a source driver coupled to the set of amplifiers, wherein the source driver supplies a voltage that corresponds to one of the $2^N$ voltage levels to the N-bit unit pixel.

2. The gamma adjustment circuitry of claim 1, wherein the two respective multiplexers receive two adjacent nodes from the $2^N$ respective nodes, respectively.

3. The gamma adjustment circuitry of claim 1, wherein the source driver comprises:
    a decoder coupled to the set of amplifiers; and
    a driver coupled to the decoder and the N-bit unit pixel, wherein the driver supplies the voltage to the N-bit unit pixel.

4. The gamma adjustment circuitry of claim 3, wherein the decoder is configured to:
    receive a signal from the set of amplifiers;
    identify a voltage level in the signal that corresponds to the one of the $2^N$ voltage levels; and
    send the voltage level to the driver.

5. The gamma adjustment circuitry of claim 1, wherein the two respective multiplexers time-multiplexes a plurality of the $2^N$ voltage levels that corresponds to the plurality of nodes in the two respective subsets of the $2^N$ respective nodes.

6. The gamma adjustment circuitry of claim 1, wherein each amplifier in the set of amplifiers comprises a respective voltage offset.

7. The gamma adjustment circuitry of claim 1, wherein the N-bit unit pixel is a sub-pixel for red, green, or blue.

8. The gamma adjustment circuitry of claim 1, wherein the N-bit unit pixel is an 8-bit pixel.

9. The gamma adjustment circuitry of claim 8, wherein the plurality of nodes comprises voltage level 112 through voltage level 143.

10. The gamma adjustment circuitry of claim 1, comprising:
    a second resistor string configured to provide the $2^N$ voltage levels on a second set of $2^N$ respective nodes;
    a second set of multiplexers, wherein each multiplexer in the second set of multiplexers is coupled a respective subset of the second set of $2^N$ respective nodes, wherein a plurality of nodes in the two respective subsets of the second set of $2^N$ respective nodes is interlaced between the two respective multiplexers in the second set of multiplexers;
    a second set of amplifiers, wherein each amplifier in the second set of amplifiers is coupled to a respective multiplexer in the second set of multiplexers; and
    a second source driver coupled to the second set of amplifiers, wherein the second source driver supplies a second voltage that corresponds to a second voltage level of the $2^N$ voltage levels to a second N-bit unit pixel in the display panel.

11. A display device, comprising
    a display panel comprising a plurality of N-bit pixels defining a viewable region of the display device; and
    a source driver integrated circuit (IC) configured to process an image data stream and to transmit the processed image data to the display panel, wherein the source driver IC comprises:
        a gamma adjustment circuitry, comprising:
            a resistor string configured to provide $2^N$ voltage levels on $2^N$ respective nodes that correspond to $2^N$ respective gray levels to be displayed in one of the plurality of N-bit unit pixels;
            a set of multiplexers, wherein each multiplexer in the set of multiplexers is coupled to a respective subset of the $2^N$ respective nodes, wherein a plurality of adjacent nodes that correspond to a respective plurality of adjacent gray levels in at least two respective subsets of the $2^N$ respective nodes is interlaced between at least two respective multiplexers in the set of multiplexers, wherein a number of the at least two respective subsets of the $2^N$ respective nodes is the same as a number of the at least two respective multiplexers;

a set of amplifiers, wherein each amplifier in the set of amplifiers is coupled to a respective multiplexer in the set of multiplexers; and a source driver coupled to the set of amplifiers, wherein the source driver supplies a voltage that corresponds to one of the $2^N$ voltage levels to the one of the plurality of N-bit pixels.

12. The display device of claim 11, wherein each N-bit pixel is an 8-bit pixel configured to display 256 gray levels.

13. The display device of claim 12, wherein each multiplexer is a 16:1 multiplexer.

14. The display device of claim 12, wherein the at least two respective subsets of the $2^N$ respective nodes comprise at least two groups of 16 gray levels, wherein the at least two groups of 16 gray levels are median gray levels of the 256 gray levels.

15. An electronic device, comprising:
one or more input devices;
a memory capable of storing executable instructions;
a processor configured to receive inputs from the one or more input devices and to execute the executable instructions; and
a liquid crystal display (LCD) having a source driver integrated circuit (IC) configured to process an image data stream and to transmit the processed image data to the LCD, wherein the source driver IC comprises:
a gamma adjustment circuitry, comprising:
a resistor string configured to provide $2^N$ voltage levels on $2^N$ respective nodes that correspond to $2^N$ respective gray levels to be displayed on an N-bit unit pixel in the LCD;
a set of multiplexers, wherein each multiplexer in the set of multiplexers is coupled to a respective subset of the $2^N$ respective nodes, wherein a plurality of adjacent nodes that correspond to a respective plurality of adjacent gray levels in at least two respective subsets of the $2^N$ respective nodes is interlaced between at least two respective multiplexers in the set of multiplexers, wherein a number of the at least two respective subsets of the $2^N$ respective nodes is the same as a number of the at least two respective multiplexers;
a set of amplifiers, wherein each amplifier in the set of amplifiers is coupled to a respective multiplexer in the set of multiplexers; and
a source driver coupled to the set of amplifiers, wherein the source driver supplies a voltage that corresponds to one of the $2^N$ voltage levels to the N-bit unit pixel in the LCD.

16. The display device of claim 15, wherein the resistor string corresponds to a red color channel, a green color channel, or a green color channel.

17. A method, comprising:
receiving image data comprising $2^N$ gray levels to be displayed in an N-bit unit pixel of a display panel, wherein the $2^N$ gray levels correspond to $2^N$ respective voltage levels;
multiplexing a plurality of respective subsets of the $2^N$ respective voltage levels using a plurality of respective multiplexers, thereby generating a plurality of respective multiplexed signals, wherein each of at least two respective multiplexers in the plurality of respective multiplexers multiplexes a plurality of adjacent voltage levels that correspond to a plurality of adjacent gray levels from each of at least two respective subsets of the $2^N$ respective voltage levels, wherein a number of the at least two respective multiplexers is the same as a number of the at least two respective subsets of the $2^N$ respective nodes;
buffering each of the plurality of respective multiplexed signals, thereby generating a plurality of respective buffered multiplexed signals;
decoding one of the plurality of respective buffered multiplexed signals one voltage level of the $2^N$ respective voltage levels; and
sending the one voltage level to the N-bit unit pixel.

18. The method of claim 17, wherein multiplexing the plurality of respective subsets of the $2^N$ respective voltage levels comprises time-multiplexing the plurality of respective subsets of the $2^N$ respective voltage levels.

19. The method of claim 17, wherein each of the plurality of respective multiplexed signals is buffered by a respective amplifier having a respective voltage offset.

20. The method of claim 17, wherein decoding the one of the plurality of respective buffered multiplexed signals comprises:
receiving an input signal that corresponds to the one of the plurality of respective buffered multiplexed signals; and
outputting a ramp-level voltage in the one of the plurality of respective buffered multiplexed signals based on the input signal.

21. The method of claim 20, wherein the input signal comprises data indicative of:
the one of the plurality of respective buffered multiplexed signals; and
the ramp-level voltage.

22. The method of claim 21, wherein the data comprises:
a most significant bit representing the one of the plurality of respective buffered multiplexed signals; and
a least significant bit representing the ramp-level voltage level.

23. The method of claim 20, wherein outputting the ramp-level voltage comprises:
determining a time window in the one of the plurality of respective buffered multiplexed signals that corresponds to the voltage level; and
outputting the ramp-level voltage in the time window.

* * * * *